United States Patent
Tokunaga

(10) Patent No.: US 6,867,153 B2
(45) Date of Patent: Mar. 15, 2005

(54) METHOD OF PURGING WAFER RECEIVING JIG, WAFER TRANSFER DEVICE, AND METHOD OF MANUFACTURING SEMICONDUCTOR DEVICE

(75) Inventor: Kenji Tokunaga, Hachioji (JP)

(73) Assignee: Trecenti Technologies, Inc., Ibaraki (JP)

( * ) Notice: Subject to any disclaimer, the term of this patent is extended or adjusted under 35 U.S.C. 154(b) by 0 days.

(21) Appl. No.: 10/764,563

(22) Filed: Jan. 27, 2004

(65) Prior Publication Data

US 2004/0152322 A1 Aug. 5, 2004

(30) Foreign Application Priority Data

Jan. 31, 2003 (JP) .................................... P2003-023640

(51) Int. Cl.[7] .......................... H01L 21/00; F26B 21/00; B65B 31/00
(52) U.S. Cl. ............................. 438/800; 34/565; 141/63
(58) Field of Search ................................ 438/800, 795, 438/689; 414/416.08, 416.03; 137/800; 141/63; 34/565, 526, 523, 417

(56) References Cited

U.S. PATENT DOCUMENTS 5,988,233 A * 11/1999 Fosnight et al. ............... 141/63

6,473,996 B1 * 11/2002 Tokunaga .................... 34/417

FOREIGN PATENT DOCUMENTS

| JP | 6-334019 | 12/1994 | .......... H01L/21/68 |
| JP | 9-246354 | 9/1997 | .......... H01L/21/68 |
| JP | 11-91864 | 4/1999 | .......... B65D/85/86 |

OTHER PUBLICATIONS

SEMI Standard E57, E1.9, E47.1.

* cited by examiner

Primary Examiner—Carl Whitehead, Jr.
Assistant Examiner—Monica D. Harrison
(74) Attorney, Agent, or Firm—Antonelli, Terry, Stout & Kraus, LLP

(57) ABSTRACT

A FOUP having semiconductor wafers received therein is transferred to a loading port and then the door of the FOUP is fixed and removed by a FIMS door and then the semiconductor wafers are taken out of the shell of the FOUP and then a predetermined manufacturing processing is performed to the semiconductor wafers. After performing the manufacturing processing, the semiconductor wafers are returned into the shell and the FIMS door is returned to a closed position and the shell is retracted about 50 mm to 65 mm to form a gap between the FIMS door and the shell. Then, purge gas is introduced from a gas introduction pipe arranged above the loading port on the left and right sides in a slanting forward direction of the FIMS door into the shell to replace the atmosphere in the shell with the purge gas.

14 Claims, 21 Drawing Sheets

METHOD OF PURGING WAFER RECEIVING JIG, WAFER TRANSFER DEVICE, AND METHOD OF MANUFACTURING SEMICONDUCTOR DEVICE

TECHNICAL FIELD OF THE INVENTION

The present invention relates to a technology for manufacturing a semiconductor device and, in particular, to a technology effectively applied to a method of purging a wafer receiving jig for storing or transferring a semiconductor wafer of 300 mm in diameter at the time of manufacturing a semiconductor, a loading port for opening or closing the wafer receiving jig, and a method of manufacturing a semiconductor device.

BACKGROUND OF THE INVENTION

In order to store or transfer a semiconductor wafer of 300 mm in diameter at the time of manufacturing a semiconductor, for example, a side door integrated wafer receiving jig is used which is called a front opening unified pod (FOUP) having an opening door in a front portion through which the semiconductor wafer is inserted into or taken out of the jig. The FOUP is constructed of a shell which is a holding part for receiving the semiconductor wafer and a door which is a part for opening or closing the shell. The FOUP holds the semiconductor wafer in a hermetically enclosed space to protect the semiconductor wafer from foreign matters or chemical pollution in the atmosphere.

In this respect, one of the FOUPs is, for example, an F300 wafer carrier made by Fluoroware, Inc. and its size and structure have been disclosed in detail (see, for example, Japanese Patent Application Laid-open No. 11-91864, SEMI Standard E57, E1.9, E47.1).

By the way, usually, the FOUP is molded of plastics and the hermeticity between the shell and the door is kept by a packing made of rubber or the like. However, the plastics has a property of allowing moisture and the like to pass and outside air easily intrudes through a sealing part made of the packing into the FOUP due to molecular diffusion or the like. Hence, the humidity and oxygen concentration in the FOUP tends to increase with the lapse of time.

Moreover, in a case where the semiconductor wafer having a resist deposited thereon is stored in the FOUP, an organic solvent evaporated from the resist is deposited on the inner wall of the shell. Hence, even after the semiconductor wafer having the resist deposited thereon is removed, the resist deposited on the inner wall of the shell is again evaporated to pollute the atmosphere in the FOUP. Moisture, oxygen, and organic pollutant in the FOUP grow a natural oxide film on the semiconductor wafer and cause the poor dielectric strength of an insulating film.

In this respect, for example, in a hermetically enclosed container which is one of hermetically enclosed wafer receiving jigs, there has been studied a method of solving the above problem in which a gas purge mechanism is provided to introduce an inert gas, for example, a nitrogen gas or dry air into the hermetically enclosed container to replace the atmosphere in the hermetically enclosed container with the inert gas.

There have been proposed, for example, a method of purging air in the cover of a container through a purging hole formed in a wall and discharging air in a gap between the cover and a specific base through a purging exhaust pipe (see, for example, Japanese Patent Application Laid-open No. 6-334019) and a method of discharging oxygen and moisture existing in a space formed between the cover of the hermetically enclosed container and the ascending/descending table of a hoisting and lowering unit through a through hole, an opening/closing unit, and a discharge passage to the outside of the main body of the station (see, for example, Japanese Patent Application Laid-open No. 9-246354).

SUMMARY OF THE INVENTION

The present inventor has thought of applying the same purging method as the above method of purging a hermetically enclosed container to a FOUP, and has studied a purging method in which an inert gas is introduced from a gas supply passage formed in the wall of the FOUP into the FOUP to discharge the atmosphere in the FOUP through an exhaust passage formed in the other wall of the FOUP to replace the atmosphere in the FOUP with the inert gas.

However, the atmosphere in the FOUP is pushed by the inert gas introduced from the gas supply passage to be flowed toward the exhaust passage, so there is presented a problem that since it is hard to replace the atmosphere in portions out of the flow of the inert gas with the inert gas, a long time is required to fill the inside of the FOUP with the inert gas.

The object of the invention is to provide a technology capable of replacing the atmosphere in a FOUP which is a jig for receiving a semiconductor wafer with an inert gas.

The above object, the other objects and novel features will be made clear by the description and the accompanying drawings of this specification.

The outline of a typical invention among the inventions disclosed in this application will be described in brief as follows.

A method of purging a FOUP in accordance with the present invention is such that by supplying a purge gas from the outside to the left and right sides of the opening of a shell for receiving a semiconductor wafer, the purge gas is introduced into the shell to discharge the atmosphere in the shell through the upper and lower portions of the opening of the shell.

A loading port in accordance with the present invention has a function of opening the door of the FOUP and a FIMS door, receiving the semiconductor wafer, closing the FIMS door, retracting the shell to form a gap between the FIMS door and the shell, and supplying the purge gas from a gas introduction pipe provided on the left and right sides in a slanting forward direction of the FIMS door into the shell.

A method of manufacturing a semiconductor device in accordance with the invention is such that at the time of storing or transferring the semiconductor wafer by the use of the FOUP, by supplying the purge gas from the outside to the left and right sides of the opening of the shell for receiving the semiconductor wafer, the purge gas is introduced into the shell to discharge the atmosphere in the shell through the upper and lower portions of the opening of the shell to replace the atmosphere in the shell with the purge gas.

BRIEF DESCRIPTIONS OF THE DRAWINGS

FIGS. 6A and 6B are construction views showing the FOUP placed on the loading port of the semiconductor manufacturing device of embodiment 1 of the invention, wherein FIG. 6A is a cross sectional view of the construction and FIG. 6B is the top plan view of the construction;

FIGS. 17A and 17B are construction views showing the FOUP placed on the base of the semiconductor manufacturing device of embodiment 3 of the invention, wherein FIG. 17A is a cross sectional view of the construction and FIG. 17B is the top plan view of the construction;

DESCRIPTION OF THE PREFERRED EMBODIMENTS

Figure 1:
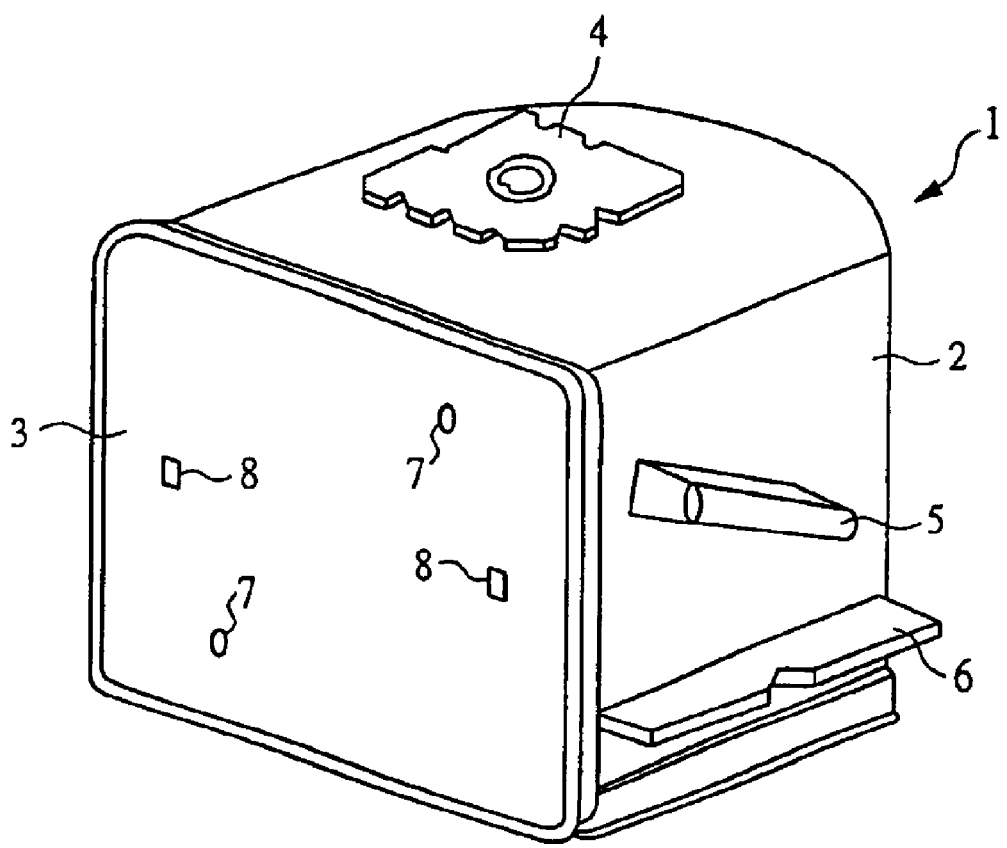
FIG. 1 is a perspective view showing one example of the outer appearance construction of a FOUP of embodiment 1 of the invention.

The preferred embodiments will be described below in detail with reference to the drawings. Here, parts having the same function are designated by the same reference numerals throughout all of the drawings for describing the preferred embodiments and their repeated descriptions will be omitted.

EMBODIMENT 1

FIG. 1 is a perspective view showing one example of the external appearance construction of a FOUP of embodiment 1 of the invention.

A FOUP 1 is constructed on a shell 2 which is a part for holding a semiconductor wafer and a door 3 which is a part for opening or closing the shell 2. A top flange 4 gripped by a robot at the time of automatically transferring the FOUP 1 by the robot is provided on the top of the shell 2. A manual handle 5 and a side rail 6 are provided on the side of the shell 2. The manual handle 5 is used, for example, at the time of lifting up the FOUP 1 by hand and the side rail 6 is used, for example, at the time of scooping up the FOUP 1 by the robot. Moreover, a breathing filter (not shown) is provided on the bottom of the shell 2.

Further, registration pin holes 7 for positioning the FOUP 1 and latch key holes 8 for opening the door 3 by the robot are formed in the outside of the door 3.

Figure 2:
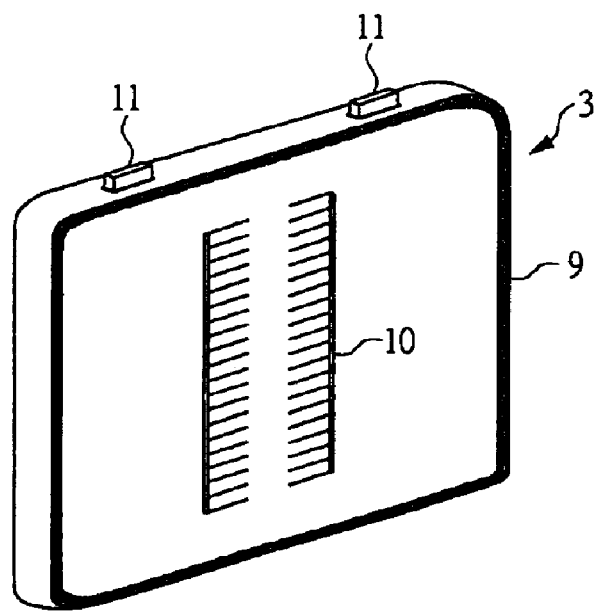
FIG. 2 is a perspective view showing one example of the inside construction of the door of the FOUP of embodiment 1 of the invention.

FIG. 2 is a perspective view showing one example of the inside construction of the door of the FOUP of embodiment 1 of the invention.

A sealing member (packing) 9 for keeping hermeticity, a retainer 10, and a clamping mechanism 11 are provided on the inside of the door 3. The sealing member 9 made of rubber is provided so as to keep the hermeticity of the FOUP 1. The retainer 10 is provided so as to press the semiconductor wafers received in the FOUP 1 and is formed of flexible teeth made of molding plastics.

The clamping mechanism 11 is provided so as to fix the door 3 to the shell 2 and is operated via the latch key holes 8. That is, the door 3 has a latch which is engaged with the inside of a door flange provided on the shell 2 and is protruded or retracted from the outer peripheral portion of the door 3 to engage with the grove of the door flange.

Figure 3:
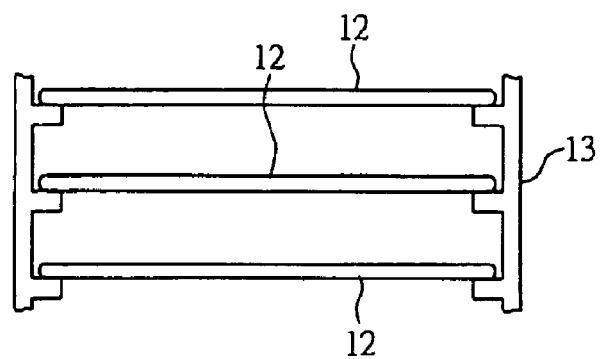
FIG. 3 is a schematic front view showing one example of the positional relationship between semiconductor wafers and wafer teeth in embodiment 1 of the invention.

FIG. 3 is a front schematic view showing one example of the positional relationship between the semiconductor wafers and wafer teeth.

A plurality of semiconductor wafers 12 received in the FOUP 1 can be placed one by one on beams called wafer teeth 13. The plurality of semiconductor wafers 12 are arranged at intervals of wafer teeth 13, for example, about 10 mm in a longitudinal direction.

Figure 4:
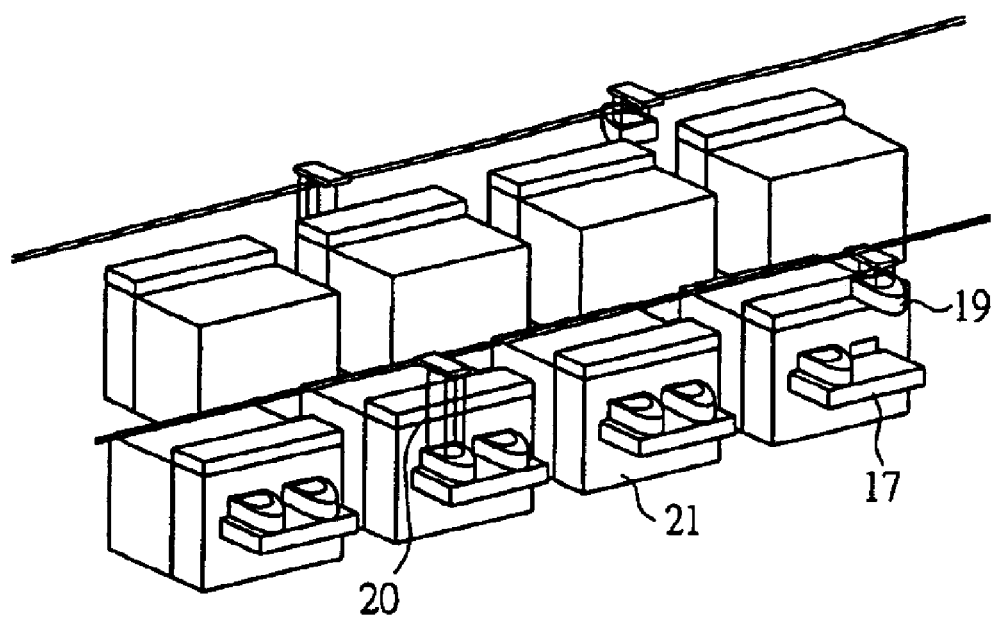
FIG. 4 is a schematic view of the automatic transfer of the FOUP using an OHT of embodiment 1 of the invention.
Figure 8:
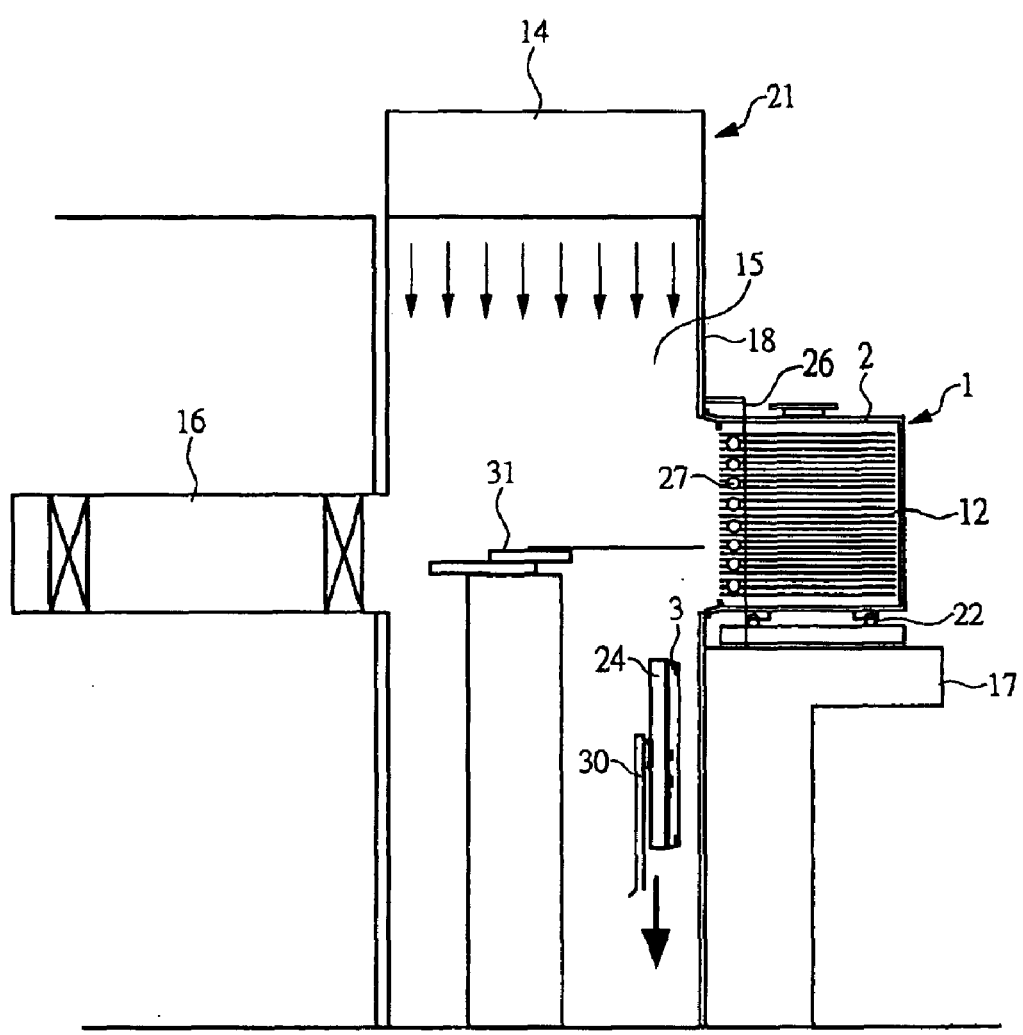
FIG. 8 is a construction view showing the semiconductor manufacturing device and the FOUP placed on the loading port of embodiment 1 of the invention.
Figure 9:
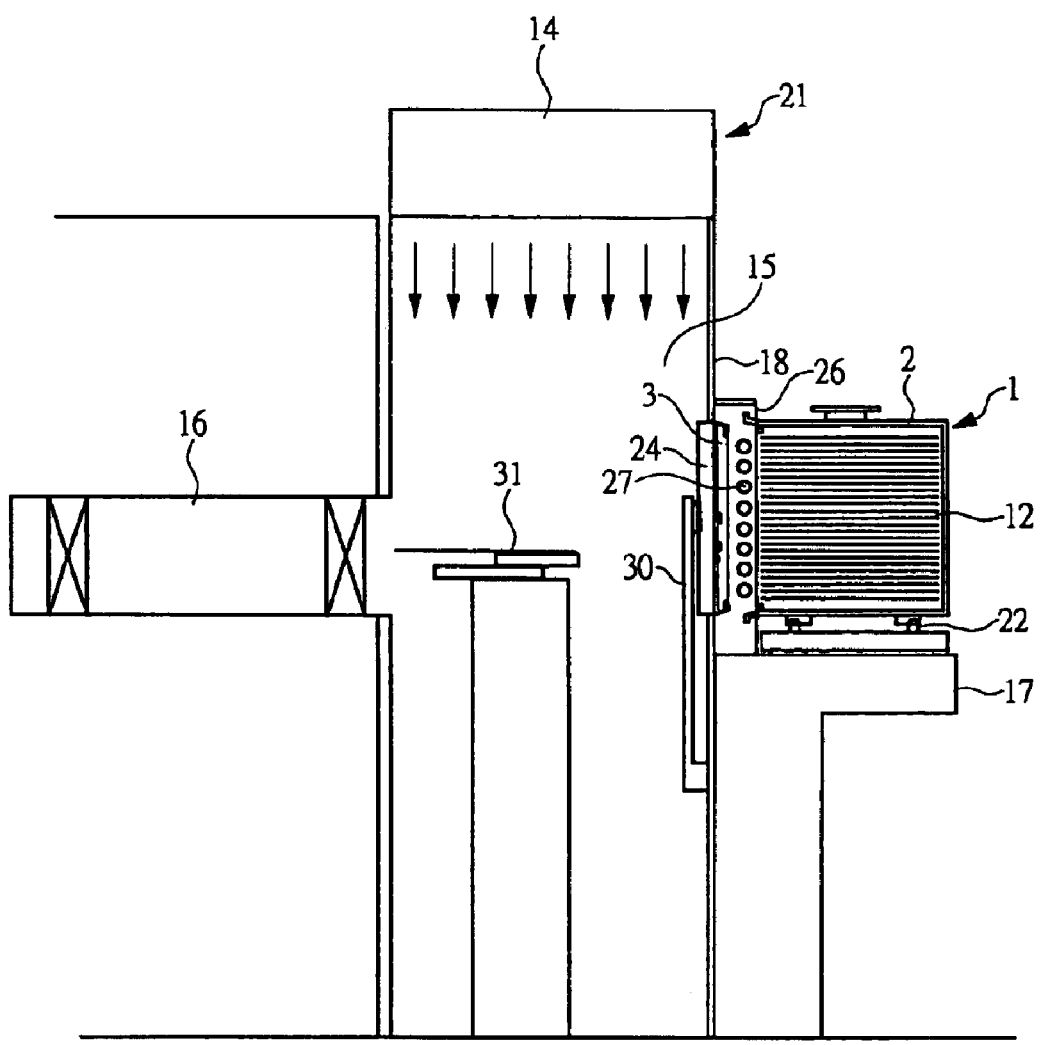
FIG. 9 is a construction view showing the semiconductor manufacturing device and the FOUP placed on the loading port of embodiment 1 of the invention.
Figure 10:
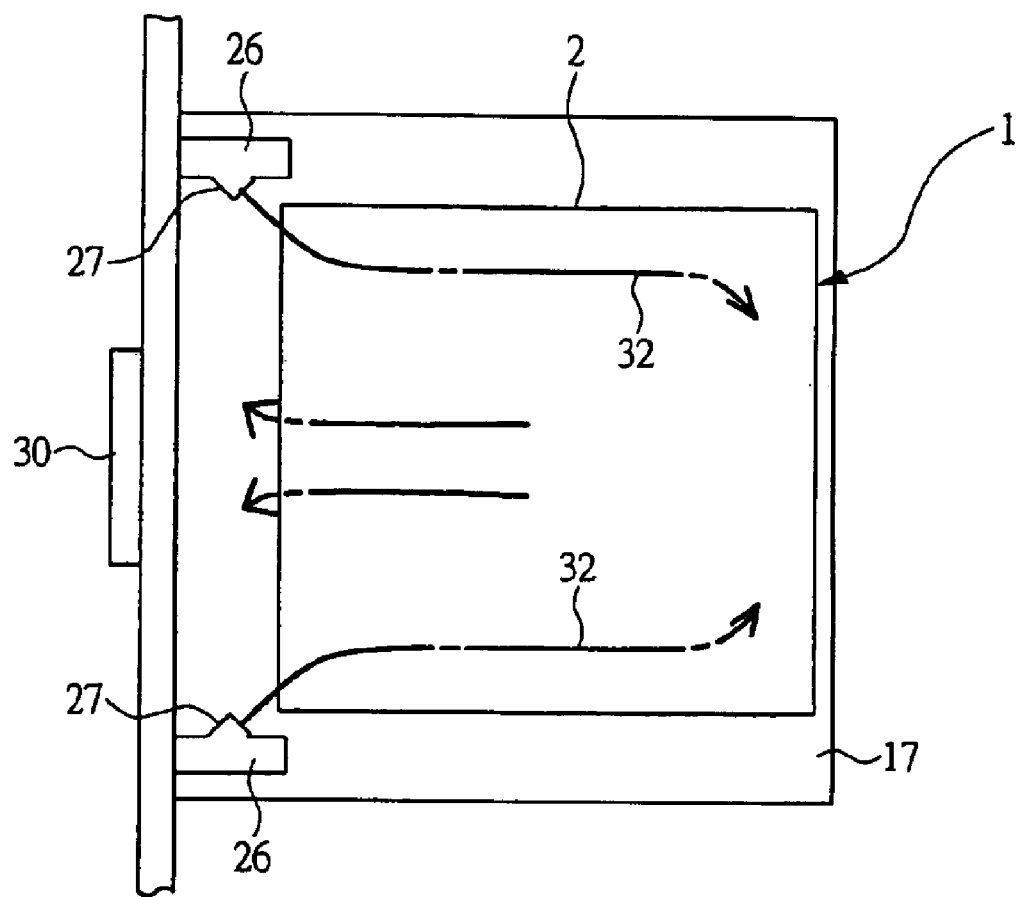
FIG. 10 is a schematic view showing the flow of purge gas of embodiment 1 of the invention.
Figure 11:
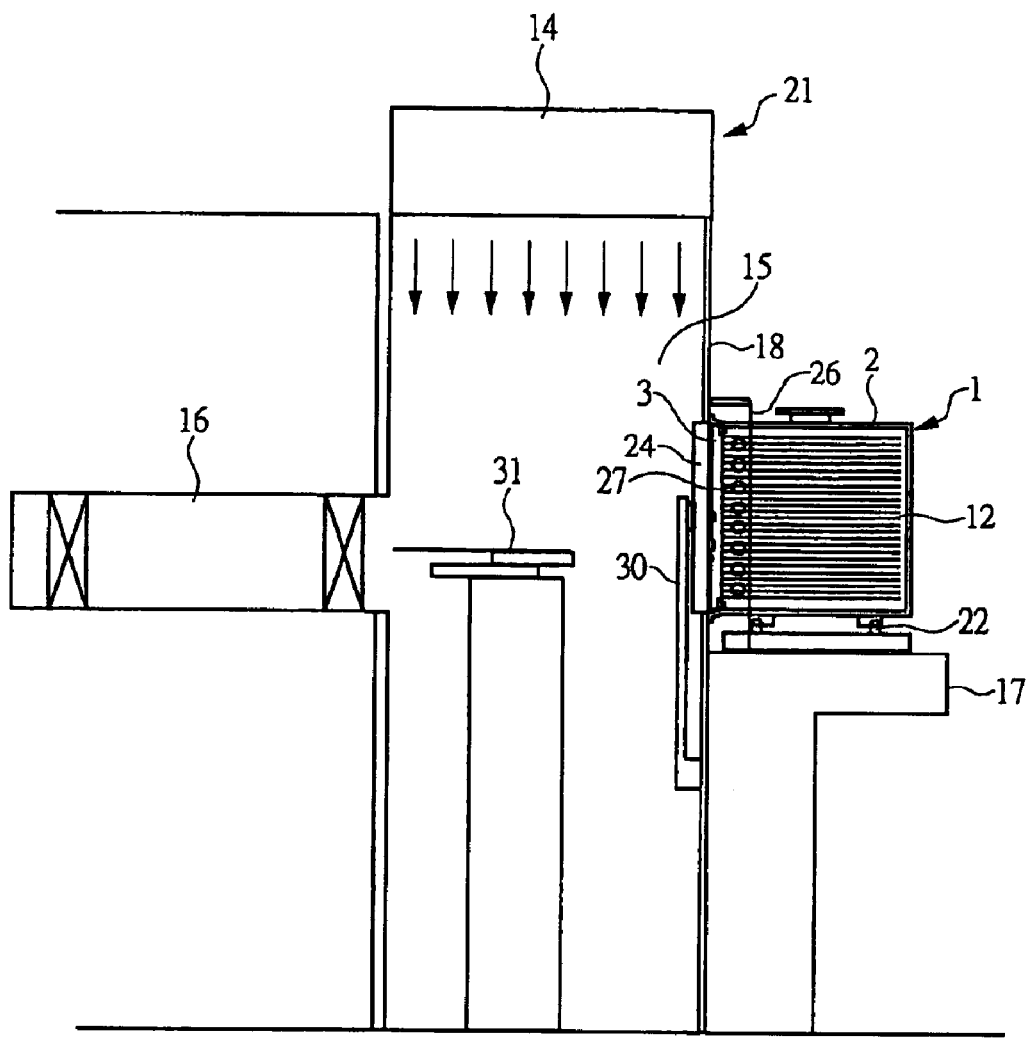
FIG. 11 is a construction view showing the semiconductor manufacturing device and the FOUP placed on the loading port of embodiment 1 of the invention.

Next, a method of purging the FOUP which is embodiment 1 of the invention will be described with reference to FIG. 4 to FIG. 11. FIG. 4 is a schematic view of the automatic transfer of the FOUP using an overhead hoist transfer (OHT). FIG. 5 is schematic views showing a method of positioning the FOUP on the loading port of the semiconductor manufacturing device. FIG. 6 is a construction view showing the FOUP placed on the loading port of the semiconductor manufacturing device. FIG. 7 is schematic side views of a gas introduction pipe. FIG. 8 is a construction view showing the semiconductor manufacturing device and the FOUP placed on the loading port. FIG. 9 is a construction view showing the semiconductor manufacturing device and the FOUP placed on the loading port. FIG. 10 is a schematic view showing the flow of purge gas. FIG. 11 is a construction view showing the semiconductor manufacturing device and the FOUP placed on the loading port.

In this respect, in the semiconductor manufacturing device shown in FIGS. 8, 9, and 11, a mini environment 15 provided with a fan filter unit (FFU) 14, a load/lock 16, and a loading port 17 are shown and a processing chamber and an exhaust system and the like are omitted. The FFU 14 means an air cleaning unit in which an ultra low penetration air-filter (ULPA) is combined with a compact blower. The mini environment 15 means a local clean environment enclosed by surroundings to isolate the semiconductor products from a pollution source. The mini environment 15 is separated from the outside by a box surface 18 and the degree of cleanliness in the mini environment 15 is, for example, Class 1 and the degree of cleanliness of the outside is, for example, Class 1,000.

First, the FOUP 1 in which predetermined pieces of semiconductor wafers 12 on which integrated circuits (IC) are to be formed, respectively, from now on are received is transferred to the semiconductor manufacturing device, for example, from a stocker placed in a manufacturing process. Then, the semiconductor wafers 12 are transferred between the semiconductor manufacturing devices with them received in the FOUP 1. However, the FOUP 1 receiving the semiconductor wafers each having a diameter of 300 mm weighs 8 kg or more, so it is difficult for safety reason to transfer the FOUP 1 by hand.

Hence, the FOUP 1 is automatically transferred, for example, by the use of the OHT 19 shown in FIG. 4. In the OHT 19, the FOUP 1 is lifted down on the loading port 17 of a semiconductor manufacturing device 21 by the use of a hoist mechanism 20 provided in the OHT 19.

Figure 5A:
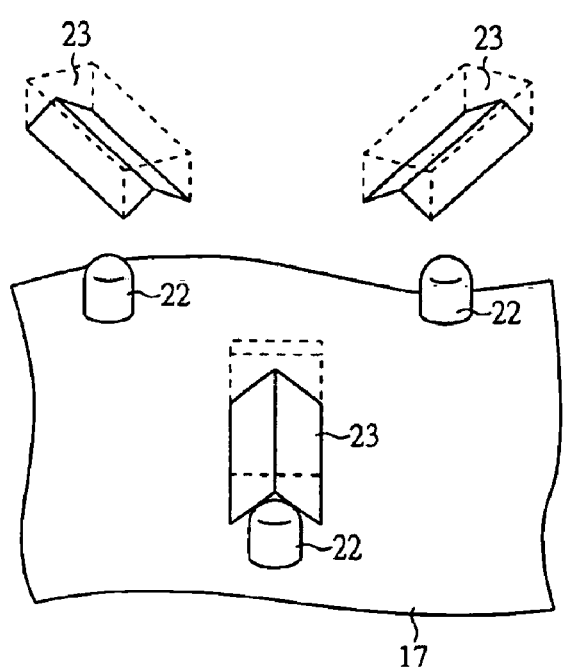
FIG. 5A is a schematic view showing a method of positioning the FOUP on the loading port of the semiconductor manufacturing device of embodiment 1 of the invention.
Figure 5B:
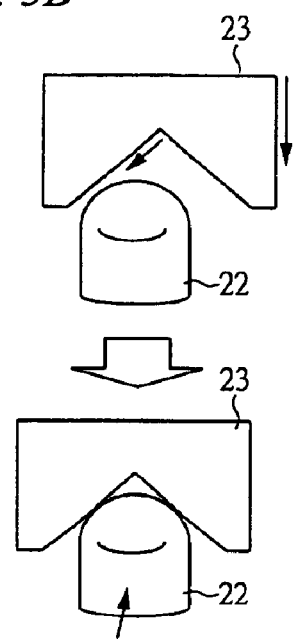
FIG. 5B is a schematic view showing a method of positioning the FOUP on the loading port of the semiconductor manufacturing device of embodiment 1 of the invention.

The loading port 17, as shown in FIG. 5A, has a plurality of (for example, three) kinematic pins 22 formed thereon. On the other hand, the bottom portion of the shell 2 of the FOUP 1 has plurality of (for example, three) grooves shaped like a letter V (hereinafter referred to as V-shaped groove) 23 each of which has a pair of slanting surfaces and is engaged with the kinematic pin 22. As shown in FIG. 5B, the position of the FOUP 1 can be fixed by putting the kinematic pins 22 in the V-shaped grooves 23. The position of the FOUP 1 is fixed on the loading port 17 and then the hoist mechanism 20 is separated from the loading port 17 and the FOUP 1 is left at a transfer position on the loading port 17.

Figure 6A:
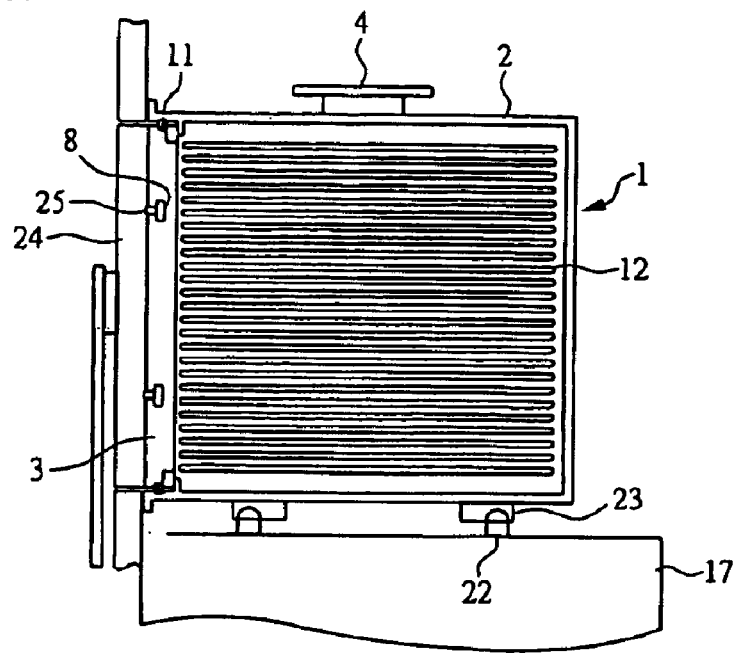
Figure 6B:
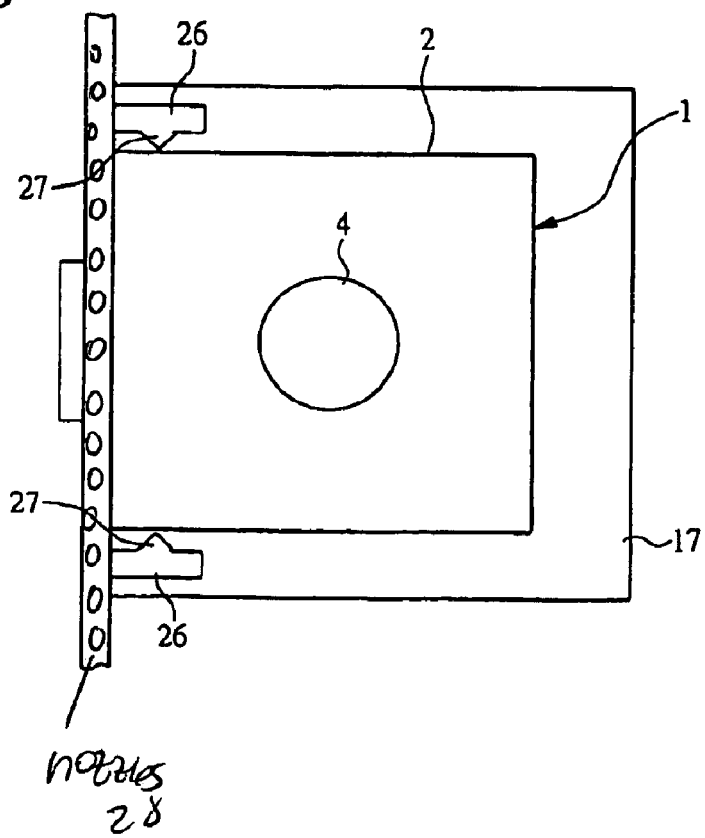

Next, as shown in FIGS. 6A and 6B (FIG. 6A is a cross sectional view of a device construction and FIG. 6B is a top plan view of the device construction), the FOUP 1 is moved forward. The loading port 17 has a standard mechanical interface (FISM) surface constructed of a FIMS door 24 and a sealing member (not shown) provided on the periphery of this FIMS door 24 on the side of the semiconductor manufacturing device 21. By moving forward the FOUP 1, the door 3 of the FOUP 1 can be engaged with the FIMS door 24. Next, when the latch key 25 is inserted into the latch key hole 8 formed in the door 3 and is turned, the clamping mechanism 11 provided on the door 3 is disengaged and the door 2 is fixed to the FIMS door 24.

Further, walls 26 are provided on the loading port 17 on the left and right sides in a slanting forward direction of the FIMS door 24 and are provided with gas introduction pipes 27 for supplying purge gas. The walls 26, as will be described below, are located on the left and right sides between the FIMS door 24 and the retracted shell 2. Further, the walls 26 may be provided on the left and right sides in a slanting forward direction of the FIMS door 24 and above the FIMS door 24 to surround the left and right sides between the FIMS door 24 and the retracted shell 2 and the upper side.

Figure 7A:
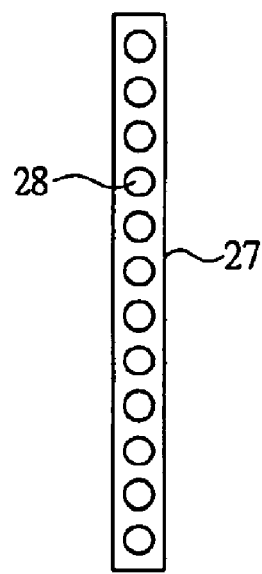
FIG. 7A is a schematic side view of the gas introduction pipe of embodiment 1 of the invention.
Figure 7B:
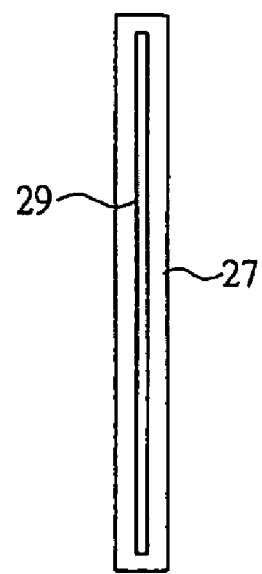
FIG. 7B is a schematic side views of the gas introduction pipe of embodiment 1 of the invention.

The gas introduction pipe 27 has, for example, a plurality of introduction nozzles 28 shown in FIG. 7A or one cutout slot shown in FIG. 7B formed so as to face the opening of the shell 2 of the FOUP 1 and the purge gas is supplied through the introduction nozzles 28 or the cutout slot 29. Here, the gas introduction pipe 27 may be provided not on the left and right sides in a slanting forward direction of the FIMS door 24 on the loading port 17 but on either of the left side and the right sides in a slanting forward direction of the FIMS door 24. Moreover, the walls 26 are not provided but only the gas introduction pipes 27 can be provided.

Next, as shown in FIG. 8, a loading port door opening/closing mechanism 30 is driven to remove the door 3 from the shell 2 to is move down the door 3 to the lower part of the semiconductor manufacturing device 21. In a state where the door 3 is removed, the semiconductor wafers 12 are taken out of the opening of the shell 2 by a wafer transfer robot 31 provided in the semiconductor manufacturing device 21 and is transferred to the processing chamber of the semiconductor manufacturing device 21 where the semiconductor wafers are subjected to a predetermined manufacturing processing. After the manufacturing processing is finished, the semiconductor wafers 12 are again returned into the shell 2 by the wafer transfer robot 31.

Next, as shown in FIG. 9, predetermined pieces of semiconductor wafers 12 received in the shell 2 are subjected to the manufacturing processing and then the FIMS door 24 is returned to a closed position and the shell 2 is retracted, for example, about from 50 mm to 65 mm, thereby being moved to a purge position. Thereafter, the purge gas is flowed from the gas introduction pipe 27 located on the left and right sides in a slanting forward direction of the FIMS door 24 above the loading port 17 to the left and right sides of the opening of the shell 2 to replace the atmosphere in the shell 2 with the purge gas. The purge gas is an inert gas, for example, a nitrogen gas or dry air. The amount of flow of gas in the case of using the nitrogen gas is, for example, several tens of l/min.

As shown in FIG. 10, the purge gas 32 (shown by a single dot and dash line in the drawing) flowing from the gas introduction pipe 27 is introduced from the left and right directions of the opening of the shell 2 into the shell 2 through the opening of the shell 2 and is flowed inside the shell 2 toward the back of the shell 2. Further, the atmosphere in the shell 2 is pushed out through the central portion of the shell 2 by the flow of the purge gas 32 and is discharged out from the upper and lower portions of the opening of the shell 2. Since the semiconductor wafers 12 are placed parallel to the flow of the purge gas 32, they do not obstruct the flow of the purge gas 32 and hence the purge gas 32 smoothly flows between the semiconductor wafers 12. In this manner, the atmosphere in all parts of the shell 2 can be replaced with the flow of the purge gas 32.

The purge gas 32 can be also introduced only from the left direction, the right direction, or the periphery of the opening of the shell 2. In a case where the purge gas 32 is introduced from the left direction of the opening of the shell 2, the purge gas 32 flows in the shell 2 and reaches the back of the shell 2 to push out the atmosphere in the shell 2, whereby the atmosphere in the shell 2 is discharged from the right side and the upper and lower sides of the opening of the shell 2. In a case where the purge gas 32 is introduced from the periphery of the opening of the shell 2, the purge gas 32 flows in the periphery of the shell 2 and reaches the back of the shell 2 to push out the atmosphere in the shell 2, whereby the atmosphere in the shell 2 is discharged out from almost the center of the opening of the shell 2.

Next, as shown in FIG. 11, the FOUP 1 is moved forward and then the door 3 is engaged with the shell 2. Further, the latch key 25 it turned to fix the door 3 to the shell 2 by the clamping mechanism 11.

Next, the FOUP 1 is retracted to be moved to a transfer position. According to a request of transfer, the vacant OHT 19 stops above the loading port 17 and the robot hand of the hoist mechanism 20 grips the top flange 4 and pulls up the FOUP 1. Thereafter, the FOUP 1 is transferred to a stocker by the OHT19 and is temporarily stored there or is transferred to the semiconductor manufacturing device of the next manufacturing process.

Next, one example of a method of manufacturing a complementary metal oxide semiconductor (CMOS) device which is one embodiment 1 of the invention will be described by the use of a cross sectional view of the main portion of a semiconductor substrate shown in FIGS. 12 to 15. In this respect, here, a cleaning process performed before forming the gate insulating film of the CMOS device is taken as an example to describe a method of purging the FOUP in accordance with the invention.

Figure 12:
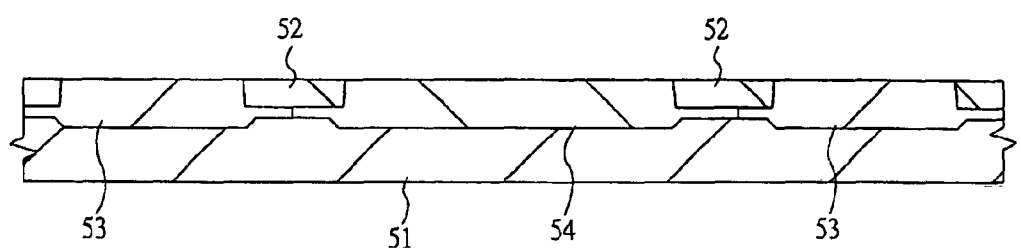
FIG. 12 is a cross sectional view of the main portion of a semiconductor substrate showing a method of manufacturing a CMOS device of embodiment 1 of the invention.

First, as shown in FIG. 12, for example, a semiconductor substrate 51 made of a p-type silicon single crystal is prepared. The semiconductor substrate 51 is a semiconductor wafer formed in a circular thin plate of 300 mm in diameter, for example. Next, a device isolation trench is formed in the semiconductor substrate 51 in a device isolation region. Then, a silicon oxide film is deposited over the semiconductor substrate 51 by a chemical vapor deposition (CVD) method and then is etched back or polished by a chemical mechanical polishing (CMP) method to leave the silicon oxide film in the device isolation trenches, whereby device isolation parts 52 are formed.

Next, impurities are ion implanted into the semiconductor substrate 51 by using a resist pattern as a mask to form p wells 53 and n wells 54. Impurities showing a p-type conduction type, for example, boron are ion implanted into the p wells 53 and impurities showing an n-type conduction type, for example, phosphor are ion implanted into the n wells 54. Thereafter, impurities for controlling the threshold of a metal insulator semiconductor field effect transistor (MISFET) may be ion implanted into the respective well regions.

Next, the surface of the semiconductor substrate 51 is cleaned by a hydrofluoric acid base water solution by the use of a pre-cleaning unit. In this pre-cleaning unit, the purging of the atmosphere in the FOUP described by the use of FIG. 6 to FIG. 11 is performed.

That is, the FOUP 1 mounted with the semiconductor wafers 12 (the semiconductor substrates 51) is transferred to the loading port 17 of the pre-cleaning unit and then the door 3 of the FOUP 1 is fixed to the FIMS door 24 on the pre-cleaning unit side. Then, the semiconductor wafers 12 (the semiconductor substrates 51) are taken out of the opening of the shell 2 of the FOUP 1 by a wafer transfer robot 31 provided in the pre-cleaning unit and are transferred to the processing chamber of the pre-cleaning unit and a cleaning processing is performed to the semiconductor wafers 12 (the semiconductor substrates 51). After the cleaning processing is finished, the semiconductor wafers 12 (the semiconductor substrates 51) are again returned to the shell 2 by the wafer transfer robot 31.

Next, a pretreatment is performed to the predetermined pieces of semiconductor wafers 12 (the semiconductor substrates 51) received in the shell 2 and then the FIMS door 24 is returned to the closed position and the shell 2 is retracted to be moved to the purge position. Then, the purge gas is flowed from the gas introduction pipe 26 located on the left and right sides in a slanting forward direction of the FIMS door 24 above the loading port 17 to supply the purge gas to the left and right sides of the opening of the shell 2 to replace the atmosphere in the shell 2 with the purge gas. Next, the shell 2 is moved forward and then the door 3 is engaged with the shell 2 and further is fixed to the shell 2. Then, the FOUP 1 is retracted to be moved to the transfer position. Thereafter, the FOUP 1 in which the semiconductor wafers 12 (the semiconductor substrates 51) are received is transferred to, for example, a storage space or a thermal oxidation unit used in the next process.

Figure 13:
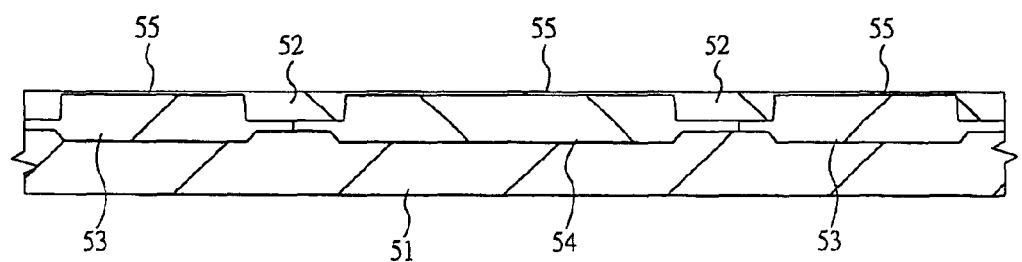
FIG. 13 is a cross sectional view of the main portion of the semiconductor substrate showing the method of manufacturing a CMOS device of embodiment 1 of the invention.

Next, as shown in FIG. 13, a silicon oxide film of about 2 nm in thickness which becomes a gate insulating film 55 is formed over the surface of the semiconductor substrate 51. In the above pre-cleaning process, the atmosphere in the FOUP 1 having the semiconductor substrates 51 after cleaning received therein is replaced with the inert gas to keep the moisture and oxygen concentration in the FOUP 1 to within lower levels. Hence, this can prevent an oxide film from being naturally formed on the surface of the semiconductor substrate 51. Therefore, even if a relatively thin insulating film of about 2 nm in thickness is formed on the surface of the semiconductor substrate 51, variations in film thickness can be reduced, which reduces variations in characteristics and prevents poor gate dielectric strength and enhances product yield.

Figure 14:
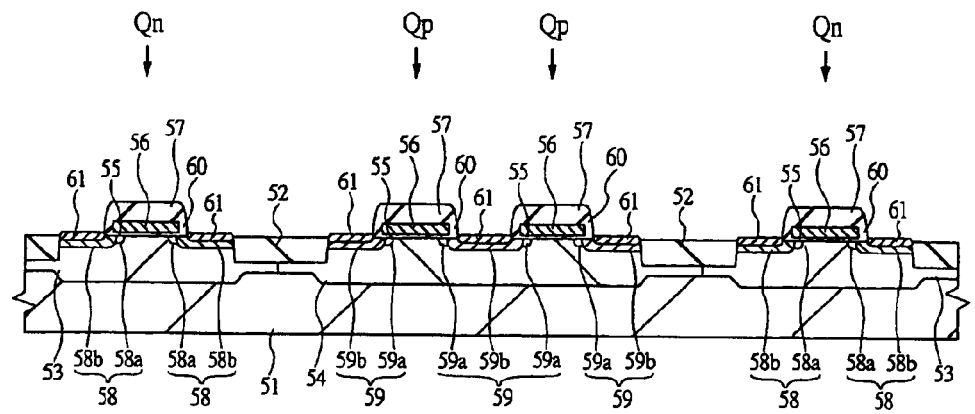
FIG. 14 is a cross sectional view of the main portion of the semiconductor substrate showing the method of manufacturing a CMOS device of embodiment 1 of the invention.

Next, as shown in FIG. 14, a silicon polycrystalline film to be a gate electrode and a silicon oxide film to be a cap insulating film are deposited in sequence to form a laminated film and then the laminated film is etched by using a resist pattern as a mask to form a gate electrode 56 and a cap insulating film 57.

Next, impurities showing an n-type conduction, for example, arsenic are ion implanted into the p wells 53 to form n-type expansion regions 58a on both sides of the gate electrode 56 on each of the p wells 53. The n-type expansion regions 58a are formed in a self-aligned manner with respect to the gate electrode 56. Similarly, impurities showing a p-type conduction, for example, boron fluoride are ion implanted into the n wells 54 to form p-type expansion regions 59a on both sides of the gate electrode 56 on each of the n wells 54. The p-type expansion regions 59a are formed in a self-aligned manner with respect to the gate electrode 56.

Thereafter, a silicon oxide film is deposited over the semiconductor substrate 51 by the CVD method and then is anisotropically etched to form a spacer 60 on the side wall of the gate electrode 56.

Next, impurities showing the n-type conduction, for example, arsenic are ion implanted into the p wells 53 to form n-type expansion regions 58b on both sides of the gate electrode 56 on each of the p wells 53. The n-type expansion regions 58b are formed in a self-aligned manner with respect to the gate electrode 56 and the spacer 60. An n-type semiconductor region 58 including the n-type expansion region 58a and the n-type expansion region 58b functions as the source and drain of an n-channel MISFET Qn.

Similarly, impurities showing the p-type conduction, for example, boron fluoride are ion implanted into the n wells 54 to form p-type expansion regions 59b on both sides of the gate electrode 56 on each of the n wells 54. The p-type expansion regions 59b are formed in a self-aligned manner with respect to the gate electrode 56 and the spacer 60. A p-type semiconductor region 59 including the p-type expansion region 59a and the p-type expansion region 59b functions as the source and drain of a p-channel MISFET Qp. Thereafter, in order to activate the impurities ion-implanted into the semiconductor substrate 51, the semiconductor substrate 51 is subjected to heat treatment.

Next, a cobalt film of about 10 nm to 20 nm in thickness is deposited over the semiconductor substrate 51, for example, by a sputtering method. Then, heat treatment is performed to the semiconductor substrate 51 to form a silicide layer 61 of about 30 nm in thickness selectively over the surface of the n-type semiconductor region 58 constructing the source and drain of the n-channel MISFET Qn and the surface of the p-type semiconductor region 59 constructing the source and drain of the p-channel MISFET Qp. Then, the not-yet-reacted cobalt film is removed and then heat treatment is performed to the semiconductor substrate 51 so as to reduce the resistance of the silicide layer 61.

Figure 15:
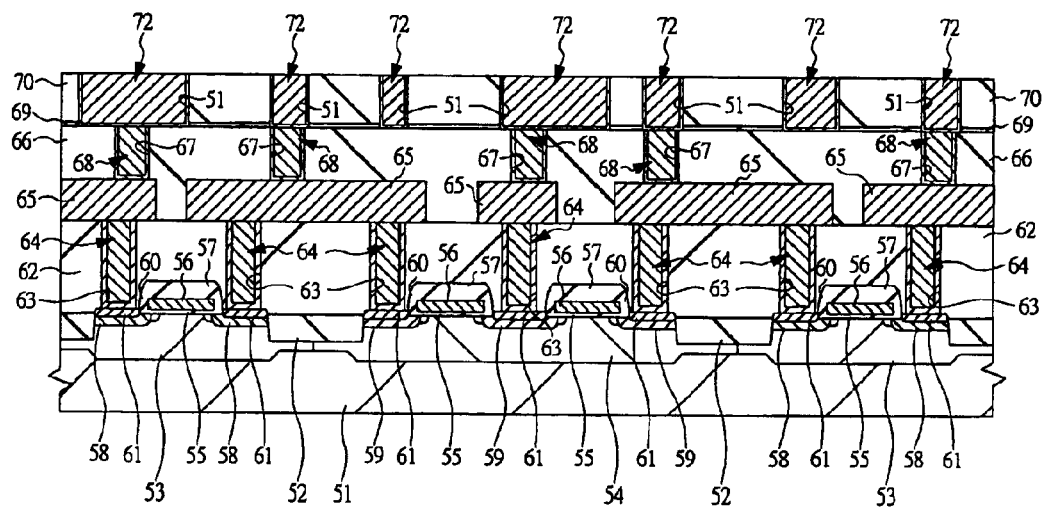
FIG. 15 is a cross sectional view of the main portion of the semiconductor substrate showing the method of manufacturing a CMOS device of embodiment 1 of the invention.

Next, as shown in FIG. 15, a silicon oxide film 62 is formed over the semiconductor substrate 51 and then is polished, for example, by the CMP method to planarize the surface of the silicon oxide film 62. Then, the silicon oxide film 62 is etched by using a resist pattern as a mask to form connection holes 63 in the silicon oxide film 62. The connection holes 63 are formed at necessary portions of the n-type semiconductor regions 58 or the p-type semiconductor regions 59.

Then, a titanium nitride film is deposited over the whole surface of the semiconductor substrate 51 including the insides of the connection holes 63, for example, by the CVD method and then a tungsten film to be buried in the connection holes 63 are deposited, for example, by the CVD method and then the titanium nitride film and the tungsten film of the regions except for the connection holes 63 are removed by the CMP method to form plugs 64 each having the tungsten film as a main conductive layer in the connection hole 63.

Next, for example, a tungsten film is formed over the semiconductor substrate 51 and then is etched by using a resist pattern as a mask to form wirings 65 of a first wiring layer. The tungsten film can be formed, for example, by the CVD method or the sputtering method.

Next, an insulating film, for example, a silicon oxide film for covering the wirings 65 is formed and then is polished, for example, by the CMP method to form an interlayer insulating film 66 whose surface is planarized. Then, the interlayer insulating film 66 is etched by using a resist pattern as a mask to form connection holes 67 in predetermined regions of the interlayer insulating film 66.

Then, a barrier metal layer is formed over the whole surface of the semiconductor substrate 51 including the insides of the connection holes 67 and then a copper film to be buried in the connection holes 67 is formed. The barrier metal layer is formed of, for example, a titanium nitride film, a tantalum film or a tantalum nitride film, for example, by the CVD method or the sputtering method. The copper film functions as a main conductive layer and can be formed, for example, by a plating method. Before forming the copper film by the plating method, a thin copper film can be formed as a seed layer, for example, by the CVD method or the sputtering method. Thereafter, the copper film and the barrier metal layer in the regions except for the connection holes 67 are removed by the CMP method to form plugs 68 in the connection holes 67.

Next, a stopper insulating film 69 is formed over the semiconductor substrate 51 and an insulating film 70 for forming a wiring is further formed over the stopper insulating film 69. The stopper insulating film 69 is, for example, a silicon nitride film and the insulating film 70 is, for example, a silicon oxide film. The stopper insulating film 69 and the insulating film 70 are etched by using a resist pattern as a mask to form wiring trenches 71 in the predetermined regions of the stopper insulating film 69 and the insulating film 70.

Then, a barrier metal layer is formed over the whole surface of the semiconductor substrate 51 including the insides of the wiring trenches 71 and a copper film to be buried in the wiring trenches 71 is formed. Thereafter, the copper film and the barrier metal layer in the regions except for the wiring trenches 71 are removed by the CMP method to form wirings 72 of a second wiring layer each of which has the copper film as a main conductive layer. Further, wirings of an upper layer are formed to almost complete a CMOS device, but its depiction and description will be omitted.

In this respect, in this embodiment 1 has been described a case where a method of purging the FOUP of the invention is applied to a pre-cleaning process performed before forming the gate insulating film of the CMOS device, but needless to say, the invention can be applied to any manufacturing process.

As described above, according to this embodiment 1, the purge gas is introduced from the outside into the left and right sides of the opening of the shell 2 to discharge the atmosphere in the shell 2 from the upper and lower sides of the opening of the shell 2, or the purge gas is introduced from the periphery of the opening of the shell 2 into the shell 2 to discharge the atmosphere in the shell 2 almost from the center of the opening of the shell 2. Hence, this can make the purge gas smoothly flow in the shell 2 and therefore replace the atmosphere in all parts of the shell 2 with the purge gas. Therefore, the atmosphere in the shell 2 can be replaced with the purge gas in a short period of time.

Embodiment 2

A method of purging a FOUP which is embodiment 2 of the invention will be described by the use of a construction view, shown in FIG. 16, of a semiconductor manufacturing device and the FOUP placed on the loading port.

As is the case with the above embodiment 1, a semiconductor manufacturing device 33 is provided with the mini environment 15 having the FFU 14 and the load/lock 16 and the loading port 17. The degree of cleanliness in the mini environment 15 separated from the outside by the box surface 18 is, for example, Class 1 and the degree of cleanliness of the outside is, for example, Class 1000. Further, a gas introduction pipe 34 capable of supplying purge gas is provided above the FIMS door 24.

As is the case with the above embodiment 1, the FOUP 1 having predetermines pieces of semiconductor wafers 12 received therein is transferred to the loading port 17 of the semiconductor manufacturing device 33. Then, the FOUP 1 is moved forward to engage the door 3 of the FOUP 1 with the FIMS door 24 on the semiconductor manufacturing device 33 side and the door 3 is fixed to the FIMS door 24. In a state where the door 3 is removed from the shell 2 of the FOUP 1, the semiconductor wafers 12 are taken out of the opening of the shell 2 by a wafer transfer robot 31 provided in the manufacturing device 33 and are transferred to the processing chamber of the manufacturing device 33 where the semiconductor wafers 12 are subjected to a predetermined manufacturing processing. After the manufacturing processing is finished, the semiconductor wafers 12 are again returned into the shell 2 by the wafer transfer robot 31.

Figure 16:
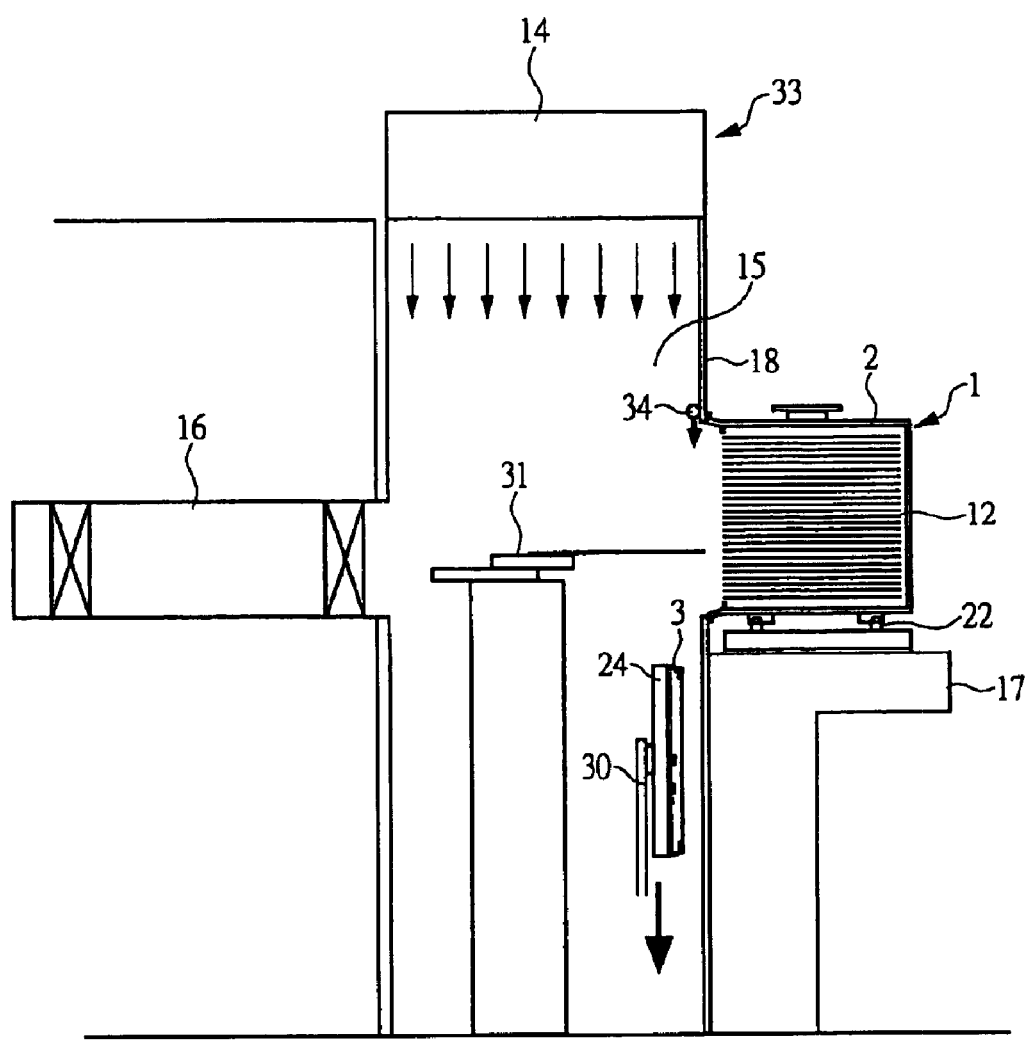
FIG. 16 is a construction view showing the semiconductor manufacturing device and the FOUP placed on the loading port of embodiment 2 of the invention.

However, in this embodiment 2, as shown in FIG. 16, the gas introduction pipe 34 is provided above the FIMS door 24. The purge gas is supplied downward from this gas introduction pipe 34 to be introduced from above the opening of the shell 2 into the shell 2, thereby substituting for the atmosphere in the shell 2. This purge gas may be supplied always in a period during which the door 3 of the FOUP 1 is removed from the shell 2 or only in a predetermined period.

In this respect, the gas introduction pipe 34 provided above the FIMS door 24 may be provided in the semiconductor manufacturing device 21 described in the above embodiment 1. With this, the atmosphere in the shell 2 can be replaced with the purge gas in a shorter period of time.

As described above, according to this embodiment 2, by supplying the purge gas into the shell 2 during processing the semiconductor wafers 12 in the semiconductor manufacturing device 33 from the gas introduction pipe 34 provided above the FIMS door 24, the atmosphere in the shell 2 can be replaced with the purge gas and hence the time required to purge the atmosphere in the shell 2 can be saved.

Embodiment 3

The structures of the FOUP and the semiconductor manufacturing device of this embodiment 3 are nearly similar to those of the FOUPs and the semiconductor manufacturing devices (see FIG. 1 to FIG. 16) of the above embodiments 1 and 2.

A method of purging the FOUP which is embodiment 3 of the invention will be described with reference to FIG. 17 to FIG. 25. FIG. 17 is a construction view showing the FOUP placed on the base of the semiconductor manufacturing device. FIG. 18 to FIG. 21 are construction views showing the semiconductor manufacturing device and the FOUP placed on the base of the semiconductor manufacturing device. FIG. 22 to FIG. 25 are schematic views showing the flow of the purge gas.

In this respect, in the semiconductor manufacturing device shown in FIG. 18 to FIG. 21, the mini environment 15 provided with the FFU 14, the load/lock 16 and a base 17A are shown, whereas the processing chamber and the exhaust system are omitted.

First, the FOUP 1 having predetermined pieces of semiconductor wafers 12 received therein is transferred, for example, from a stocker placed in the manufacturing process to the semiconductor manufacturing device 12 by the OHT 19 (see FIG. 4) and is put down on the base 17A of the semiconductor manufacturing device 21.

A plurality of kinematic pins 22 similar to the plurality of (for example, three) kinematic pins 22 (see FIG. 5A) are formed on the base 17A. On the other hand, the position of the FOUP 1 can be fixed by fitting the kinematic pins 22 in V-shaped grooves 23 (see FIG. 21) formed on the bottom of the shell 2 of the FOUP 1. The position of the FOUP 1 is fixed on the base 17A and then the hoist mechanism 20 is separated to leave the FOUP 1 in the transfer location (loading/unloading position) on the base 17A (see FIG. 18).

Figure 17A:
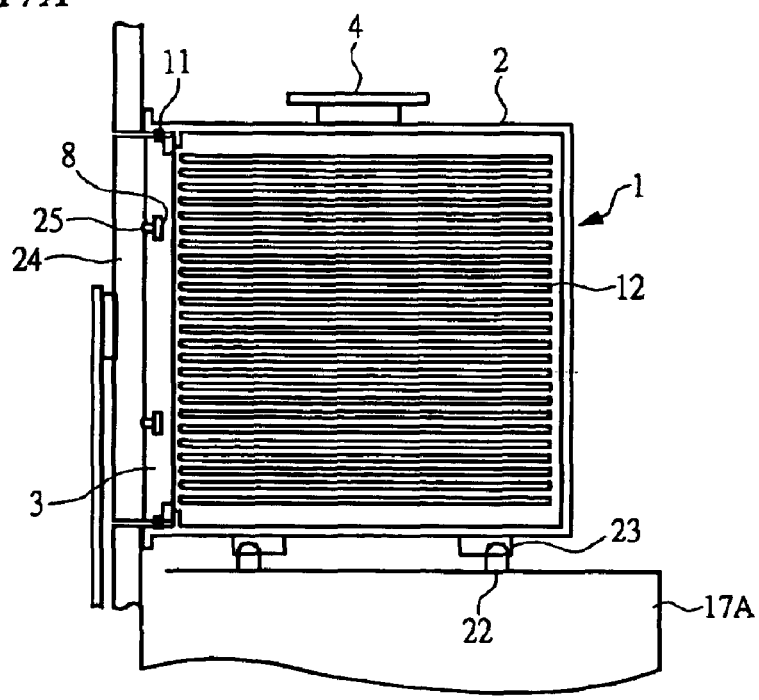
Figure 17B:
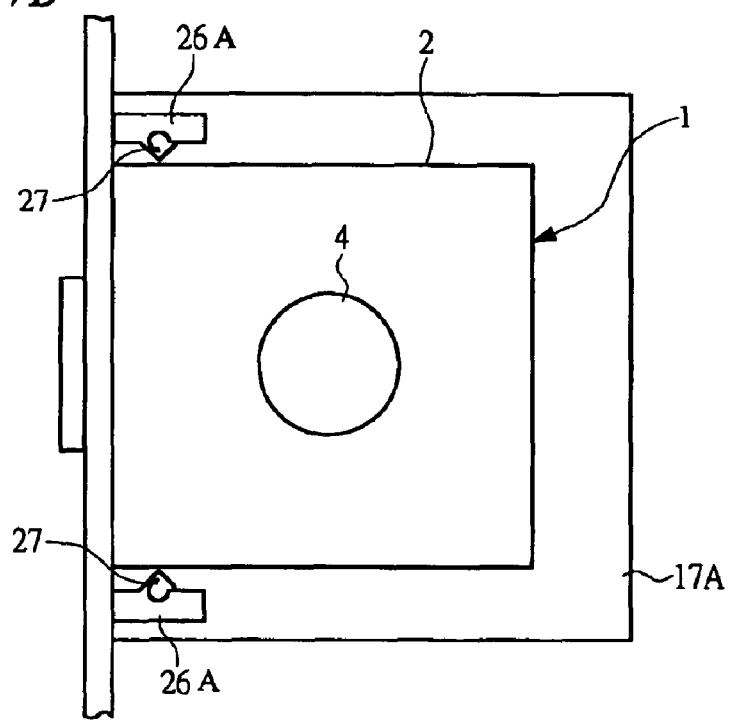
Figure 18:
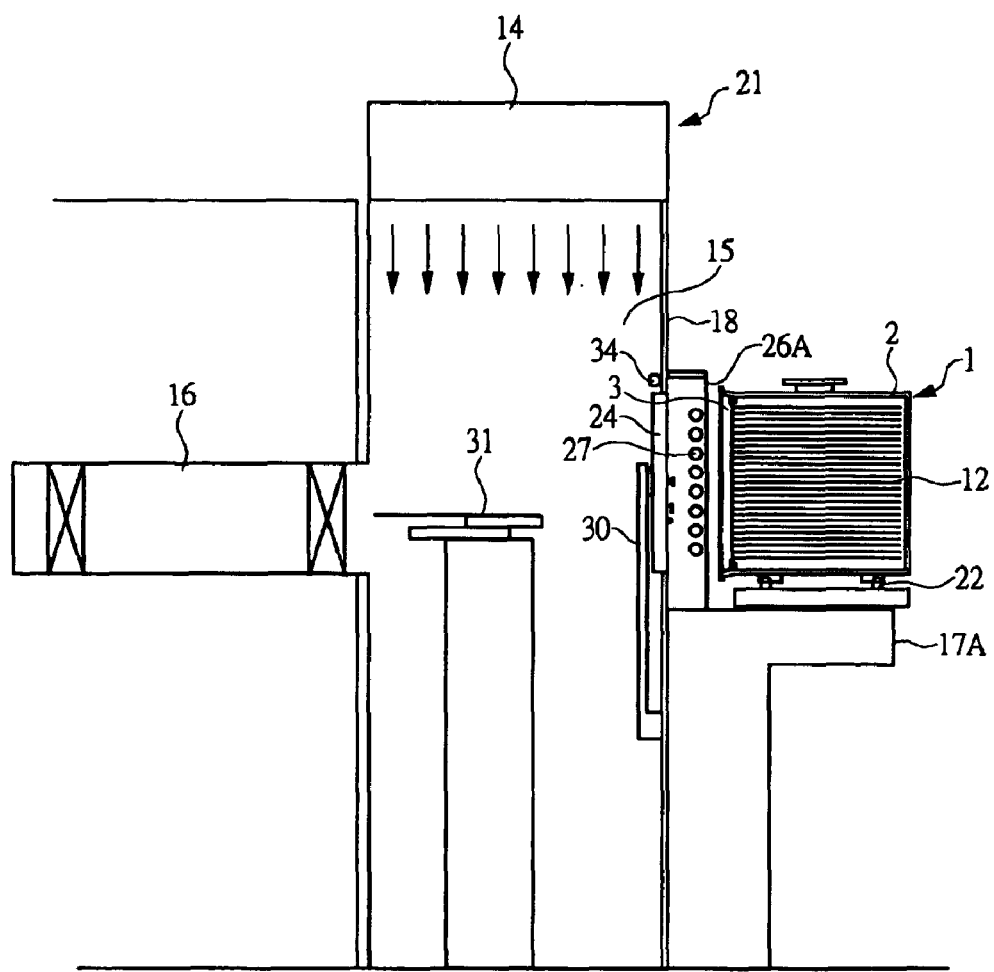
FIG. 18 is a construction view showing the semiconductor manufacturing device and the FOUP placed on the base of embodiment 3 of the invention.
Figure 19:
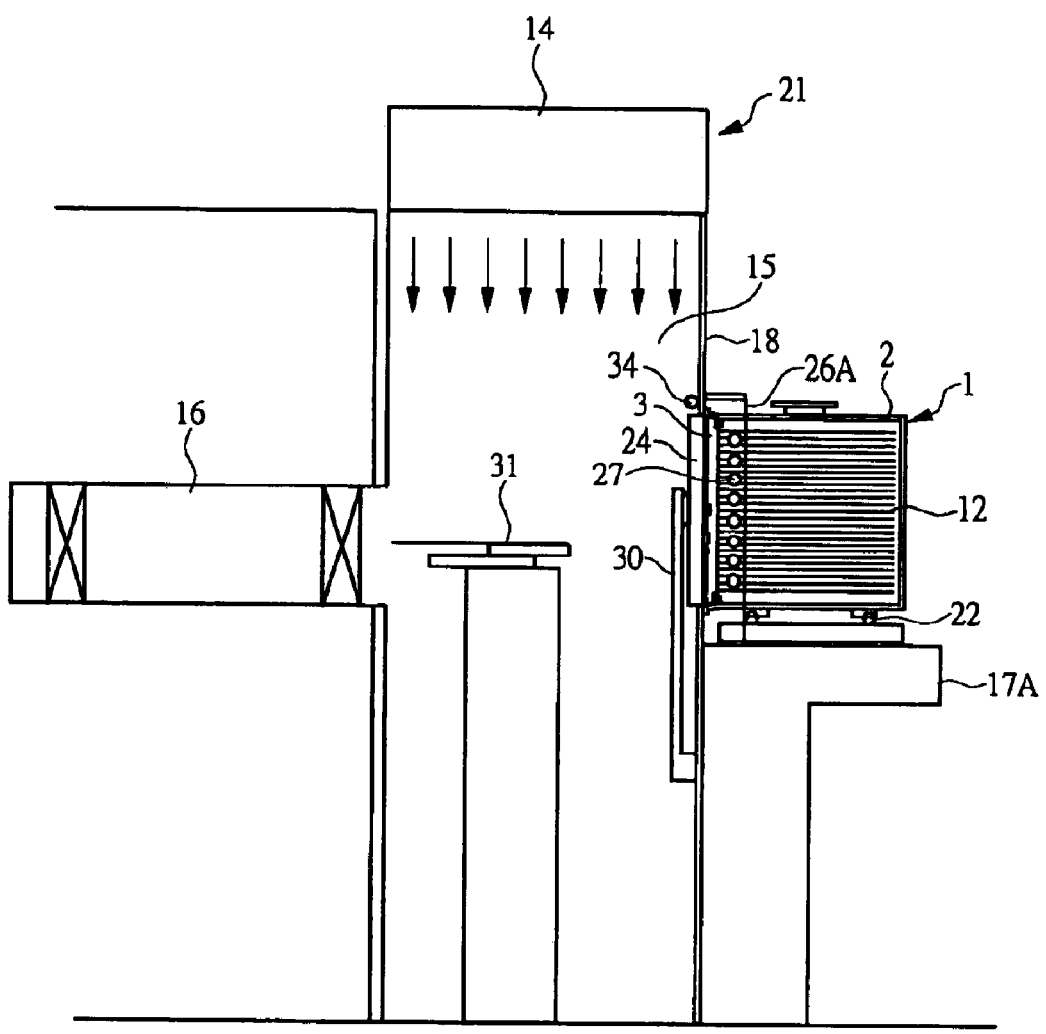
FIG. 19 is a construction view showing the semiconductor manufacturing device and the FOUP placed on the base of embodiment 3 of the invention.

Next, as shown in FIGS. 17A and 17B (FIG. 17A is a cross sectional view of the device and FIG. 17B is a top plan view of the device), the FOUP 1 is moved forward to be arranged at a docking position where the door 3 of the FOUP 1 is engaged with the FIMS door 24. The semiconductor manufacturing device 21 has an FIMS opening in the box surface 18 opposed to the base 17A and an FIMS surface constructed of the FIMS door 24 mounted to the FIMS opening such that they are in close contact with each other and a sealing member (not shown) fixed to the periphery of the FIMS door 24. The door 3 of the FOUP 1 can be engaged with the FIMS door 24 by moving forward the FOUP 1. Next, the latch key 25 is inserted into the latch key holes 8 formed in the door 3 and is turned to unlatch the clamping mechanism 11 provided on the door 3, whereby the door 3 is fixed to the FIMS door 24.

Further, on the base 17A side of the box surface 18, there is provided an outside air intercepting mechanism 26A which surrounds the opening side of the shell 2 via a gap together with the base 17A and prevents the outside air from flowing into the shell 2. The outside air intercepting mechanism 26A is provided with a gas introduction pipe (purge gas introduction means) 27 for supplying purge gas. The outside air intercepting mechanism 26A, as will be described below, is located on the left and right sides between the FIMS door 24 and the retracted shell 2. The base 17A, the box surface 18, the FIMS opening, the FIMS door 24, the outside air intercepting mechanism 26A and the gas introduction pipe 27 forms the loading port (wafer transfer unit) of this embodiment 3.

The gas introduction pipe 27 has a plurality of introduction nozzles 28 as shown in FIG. 7A in the above embodiment 1 or one slit-shaped cutout slot 29 as shown in FIG. 7B formed toward the opening of the shell 2 of the FOUP 1. The purge gas is supplied from the introduction nozzles 28 or the cutout slot 29. Here, the gas introduction pipe 27 is not provided on the outside air intercepting mechanism 26A on both of the left and right sides when viewed from the FIMS door 24 above the base 17A but may be provided on the outside air intercepting mechanism 26A only on either of the left and right sides. Further, the gas introduction pipe 27 may be provided on the outside air intercepting mechanism 26A on both of the upper and lower sides or the upper side when viewed from the FIMS door 24 above the base 17A. Still further, the outside air intercepting mechanism 26A is not provided but only the gas introduction pipe 27 can be provided. Still further, the gas introduction pipe 34 capable of supplying the purge gas is provided above the FIMS door 24.

Figure 20:
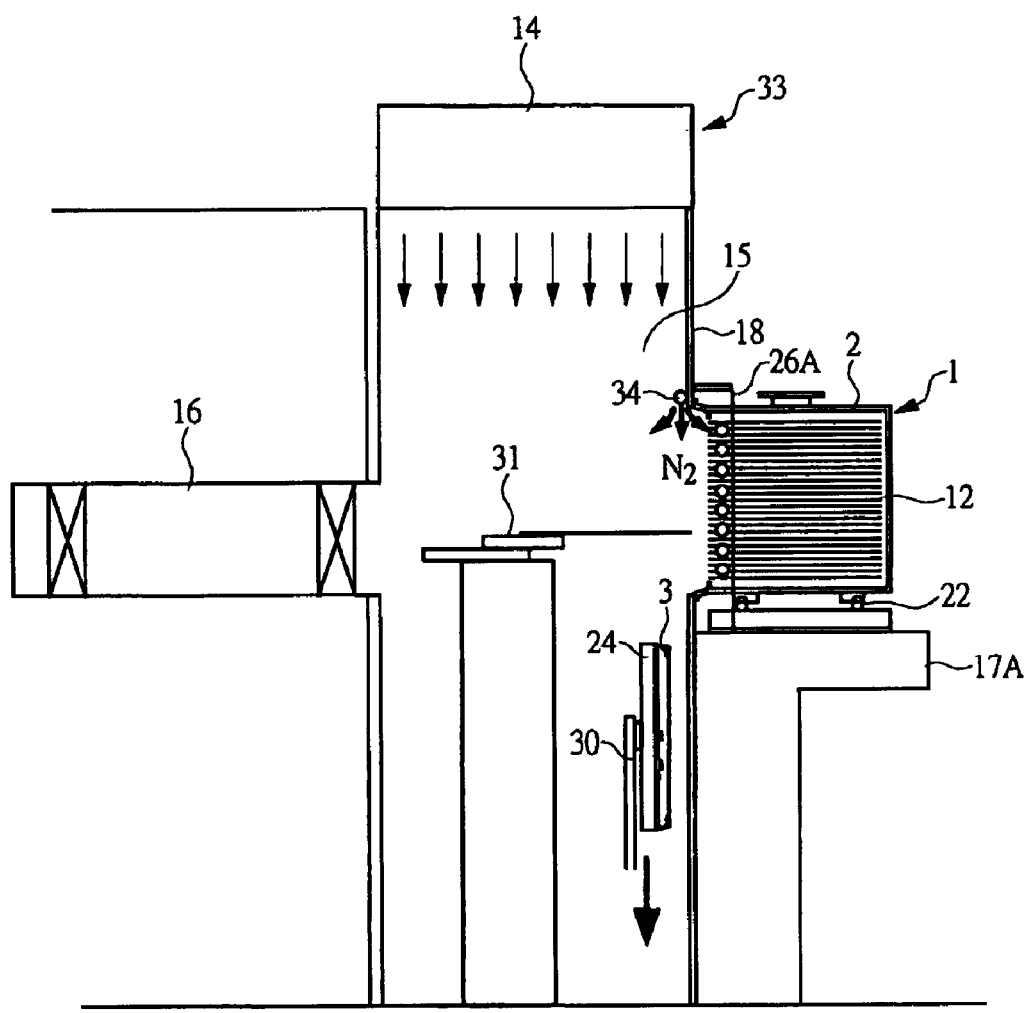
FIG. 20 is a construction view showing the semiconductor manufacturing device and the FOUP placed on the base of embodiment 3 of the invention.

Next, as shown in FIG. 20, the loading port door opening/closing mechanism 30 is driven, whereby the door 3 is removed from the shell 2, separated from the FOUP 1, and then moved downward along the box surface 18 in the mini environment 15. In a state where the door 3 is removed, the semiconductor wafers 12 are taken out of the opening of the shell 2 by a wafer transfer robot 31 provided in the manufacturing device 21 and are transferred to the processing chamber of the manufacturing device 21 where the semiconductor wafers 12 are subjected to a predetermined manufacturing processing. After the manufacturing processing is finished, the semiconductor wafers 12 are again returned into the shell 2 by the wafer transfer robot 31. In this embodiment 3, the purge gas (for example, $N_2$ (nitrogen) gas) is discharged downward from the gas introduction pipe 34 in a period during which the door 3 of the FOUP 1 is removed from the shell 2. After this purge gas is discharged from the gas introduction pipe 34, the purge gas is diffused and intruded into the shell 2, whereby the atmosphere in the shell 2 is replaced with the purge gas.

Figure 21:
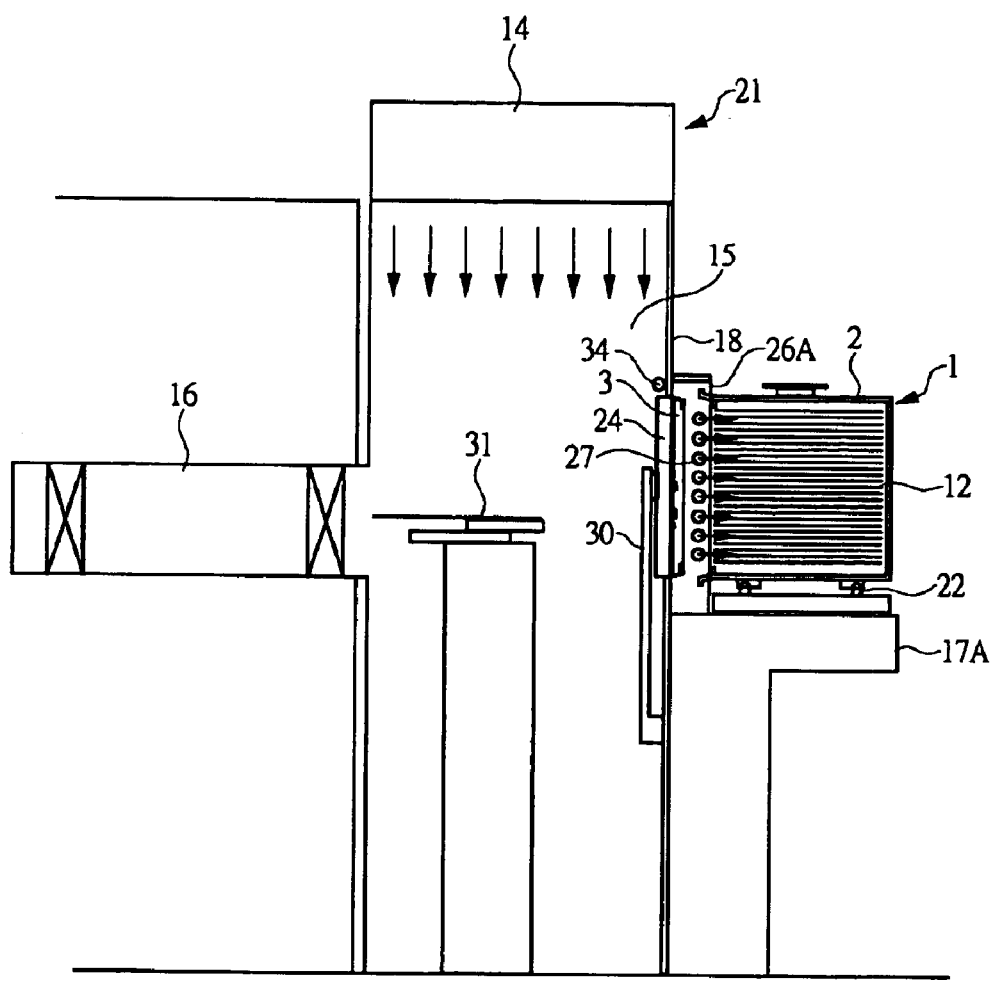
FIG. 21 is a construction view showing the semiconductor manufacturing device and the FOUP placed on the base of embodiment 3 of the invention.

Next, as shown in FIG. 21, the predetermined pieces of semiconductor wafers 12 received in the shell 2 are subjected to the manufacturing processing and then the FIMS door 24 is returned to the closing position and the shell 2 is retracted, for example, about 50 mm to 65 mm to be transferred to the purge location (purge position). Thereafter, the purge gas is flowed from the gas introduction pipe 27 and is introduced into the left and right sides of the opening of the shell 2, whereby the atmosphere in the shell 2 is replaced with the purge gas. The purge gas is an inert gas, for example, nitrogen gas or dry air. The amount of flow of gas in the case of using the nitrogen gas is, for example, several tens of l/min.

Figure 22:
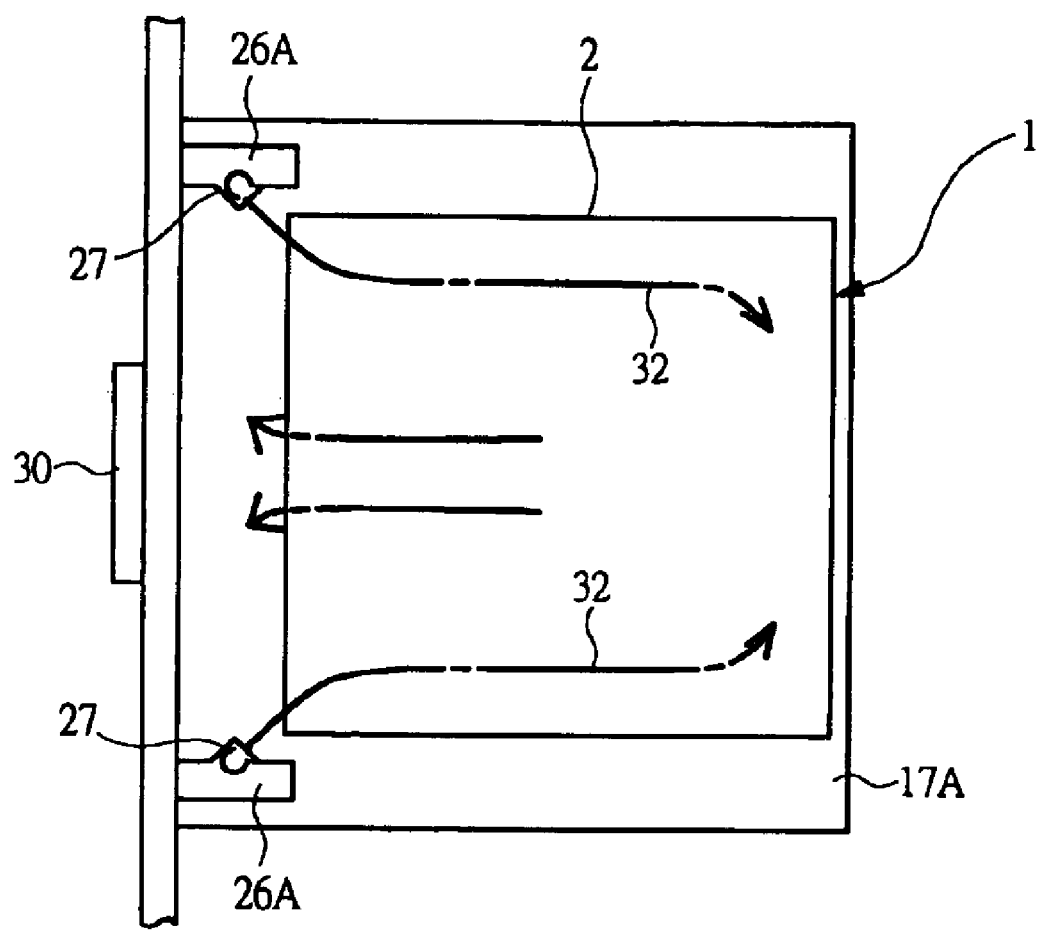
FIG. 22 is a schematic view showing the flow of purge gas of embodiment 3 of the invention.

As shown in FIG. 22, the purge gas 32 flowing from the gas introduction pipe 27 (shown by a single dot and dash line in the drawing) is introduced from the left and right directions of the opening of the shell 2 to flow from the opening of the shell 2 through the left side (first passage) and the right side (first passage) in the shell 2 toward the back of the shell 2. Further, the atmosphere in the shell 2 is pushed out through the center (second passage) by the flow of the purge gas 32 to be discharged out from the upper and lower portions of the opening of the shell 2. Since the semiconductor wafers 12 are arranged parallel to the flow of the purge gas 32, they do not intercept the flow of the purge gas 32 and the purge gas smoothly flows between the semiconductor wafers 12. Hence, the atmosphere in all parts of the shell 2 can be replaced with the purge gas 32 flowing in this manner.

Figure 23:
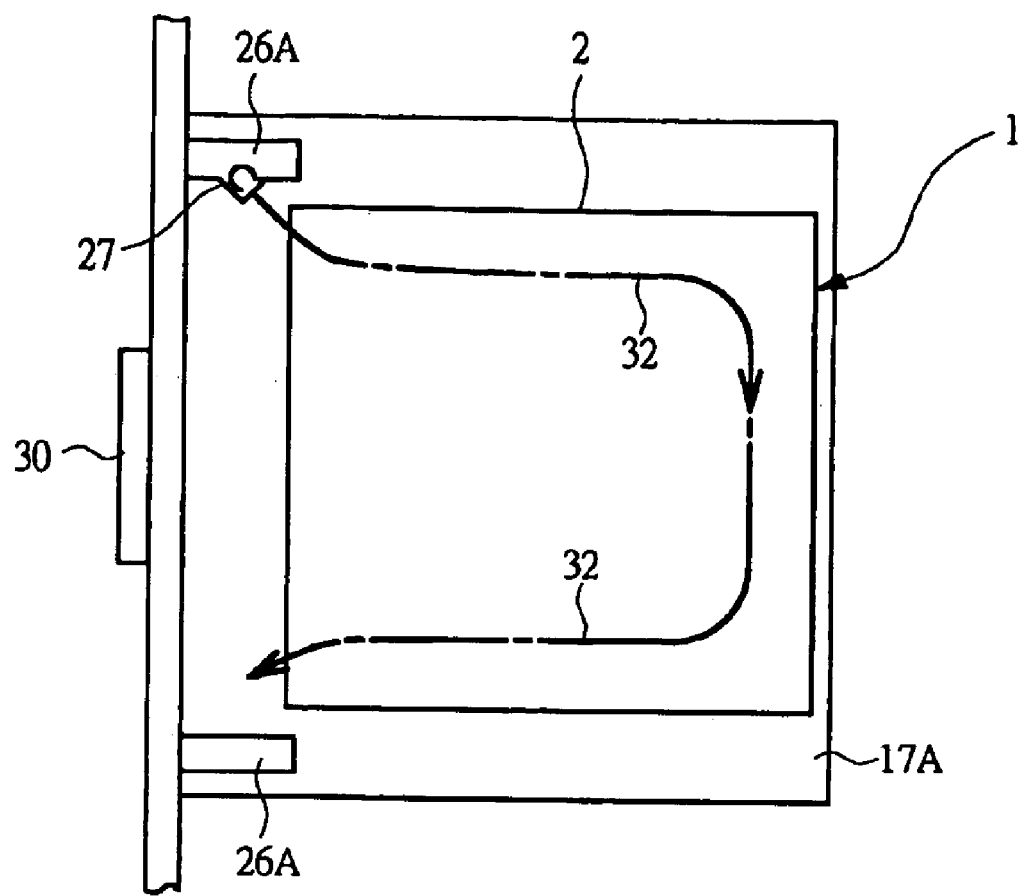
FIG. 23 is a schematic view showing the flow of purge gas of embodiment 3 of the invention.

Further, as shown in FIG. 23, the purge gas 32 can be introduced only from the left direction or the right direction of the opening of the shell 2. In a case where the purge gas is introduced from the left direction of the opening of the shell 2, the purge gas 32 flows in the left side (first passage) in the shell 2 and reaches the back of the shell 2 to push out the atmosphere in the shell 2, whereby the atmosphere in the shell 2 is discharged from the right side (second passage) and the upper and lower sides (second passage) of the opening of the shell 2.

Figure 24:
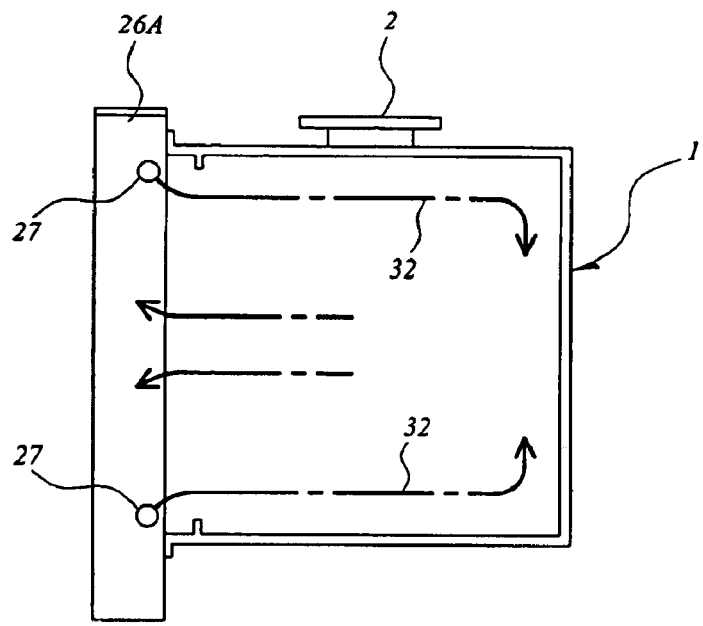
FIG. 24 is a schematic view showing the flow of purge gas of embodiment 3 of the invention.

Still further, the purge gas 32 can be also introduced from the periphery of the opening of the shell 2 (see FIG. 22 as a plan view and FIG. 24 as a cross sectional view). In a case where the purge gas 32 is introduced from the periphery of the opening of the shell 2, the purge gas 32 flows in the periphery (first passage) in the shell 2 and reaches the back of the shell 2 to push out the atmosphere in the shell 2, whereby the atmosphere in the shell 2 is discharged nearly from the center (second passage) of the opening of the shell 2.

Figure 25:
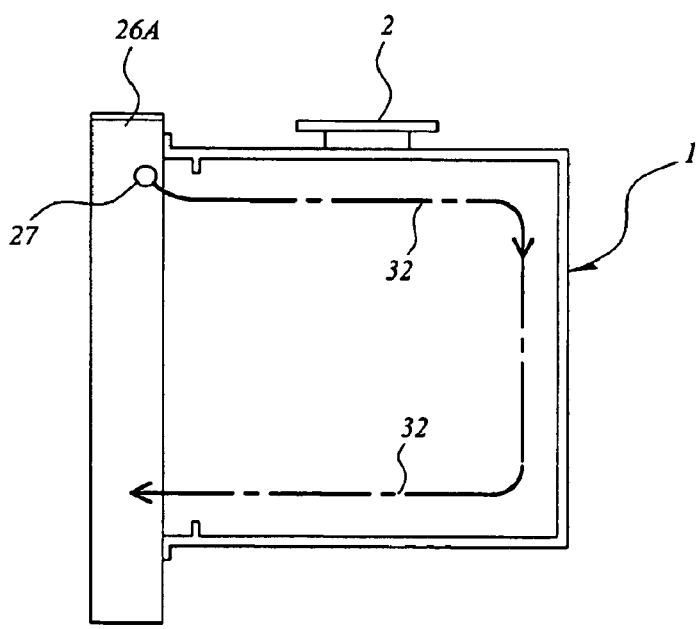
FIG. 25 is a schematic view showing the flow of purge gas of the embodiment 3 of the invention.

Still further, as shown in FIG. 25, the purge gas 32 can be also introduced only from the upper portion of the opening of the shell 2. In a case where the purge gas 32 is introduced only from the upper portion of the opening of the shell 2, the purge gas 32 flows in the upper side (first passage) in the shell 2 and reaches the back of the shell 2 to push out the atmosphere in the shell 2, whereby the atmosphere in the shell 2 is discharged out from the lower portion (second passage) and the left and right portions (second passage) of the opening of the shell 2.

Next, the FOUP 1 is moved forward to be arranged at the docking position and then the door 3 is engaged with the shell 2. Further, the latch key 25 is turned to fix the door 3 to the shell 2 by the clamping mechanism 11 (see FIG. 19).

Next, the FOUP 1 is retracted to be moved to a transfer location (loading/unloading position). A vacant OHT 19 is stopped above the base 17A by a request of transfer and the hoist mechanism 20 grips the top flange 4 by the robot hand to pull up the FOUP 1. Thereafter, the FOUP 1 is transferred to the stocker by the OHT 19 and is temporarily stored in the stocker or is transferred to the semiconductor manufacturing device of the next manufacturing process.

Up to this point, the invention made by the present inventor has been described on the basis of the preferred embodiments of the invention. However, the invention is not limited to the above embodiments but needless to say, can be variously modified within the spirit and scope of the invention.

For example, while the OHT has been taken as the automatic transfer unit in the above embodiments, an automated guided vehicle (AGV) or a rail guided vehicle (RGV) may be used or a manual transfer such as person guided vehicle (PGV) may be used.

The brief description of effect produced by the typical invention of the inventions disclosed in this application is as follows.

The purge gas smoothly flows in the FOUP which is the jig of receiving the semiconductor wafers and hence can substitute for the atmosphere in all parts of the FOUP within a short period of time.

What is claimed is:

1. A method of purging a wafer receiving jig provided with a holding part that has an opening to receive and hold a semiconductor wafer therein and an opening/closing door that is provided at the opening, wherein the opening/closing door is separated a predetermined distance from the opening to form a gap between the opening and the opening/closing door, and wherein purge gas is introduced into the holding part from the gap between the opening and the opening/closing door to discharge atmosphere in the holding part through a second passage other than a first passage through which the purge gas is introduced to the outside of the holding part.

2. The method of purging a wafer receiving jig as claimed in claim 1, wherein the purge gas is introduced from both of left and right sides of the opening shaped like a rectangle into the holding part to discharge the atmosphere in the holding part through both of upper and lower sides of the opening.

3. The method of purging a wafer receiving jig as claimed in claim 1, wherein the purge gas is introduced from one side of the left and right sides of the opening shaped like a rectangle into the holding part to discharge the atmosphere in the holding part through at least other side of the left and right sides of the opening.

4. The method of purging a wafer receiving jig as claimed in claim 1, wherein the purge gas is introduced from upper and lower sides and left and right sides of the opening shaped like a rectangle into the holding part to discharge the atmosphere in the holding part through a central portion of the opening.

5. The method of purging a wafer receiving jig as claimed in claim 1, wherein the purge gas is introduced from an upper side of the opening shaped like a rectangle into the holding part to discharge the atmosphere in the holding part through at least a lower side of the opening.

6. A wafer transfer device comprising:
a box for partitioning a mini environment of a semiconductor manufacturing device;
a base that is provided adjacently to the box and has a wafer receiving case placed thereon, the case being provided with a holding part having an opening to receive and hold a semiconductor wafer therein and a opening/closing door provided at the opening;
a FIMS opening that is formed at a portion corresponding to the wafer receiving case of the box;
a FIMS door that is in close contact with the FIMS opening and prevents outside air from entering the mini environment;
a cover that is provided on the base side of the box and surrounds the opening side of the holding part via a gap together with the base; and
purge gas introduction means that is provided at the opening and introduces purge gas at least from one direction of the periphery of the opening.

7. The wafer transfer device as claimed in claim 6, wherein the purge gas introduction means is a pipe provided with a plurality of introduction nozzles and is provided along the opening of the wafer receiving case.

8. The wafer transfer device as claimed in claim 6, wherein the purge gas introduction means is a pipe provided with a cutout slot formed along the opening.

9. The wafer transfer device as claimed in claim 6, wherein the base has at least three positions where the receiving case is placed, the three positions being a loading/unloading position that is farthest from the box, a docking position where the opening/closing door is fixed to the FIMS door, and a purge position that is located in the middle of the loading/unloading position and the docking position.

10. A method of manufacturing a semiconductor device in which a semiconductor wafer is stored and transferred by the use of a wafer receiving jig that has a holding part having an opening to receive and hold a semiconductor wafer therein and an opening/closing door provided at the opening,
wherein the door opening/closing door is separated a predetermined distance from the opening to form a gap between the opening and the opening/closing door and wherein purge gas is introduced into the holding part from the gap between the opening and the opening/closing door to discharge atmosphere in the holding part through a second passage other than a first passage through which the purge gas is introduced to the outside of the holding part.

11. The method of manufacturing a semiconductor device as claimed in claim 10, wherein the purge gas is introduced from both of left and right sides of the opening shaped like a rectangle into the holding part to discharge the atmosphere in the holding part through both of upper and lower sides of the opening to replace the atmosphere in the holding part with the purge gas.

12. The method of manufacturing a semiconductor device as claimed in claim 10, wherein the purge gas is introduced from one side of the left and right sides of the opening shaped like a rectangle into the holding part to discharge the atmosphere in the holding part through at least other side of the left and right sides of the opening to replace the atmosphere in the holding part with the purge gas.

13. The method of manufacturing a semiconductor device as claimed in claim 10, wherein the purge gas is introduced from upper and lower sides and left and right sides of the opening shaped like a rectangle into the holding part to discharge the atmosphere in the holding part through a central portion of the opening to replace the atmosphere in the holding part with the purge gas.

14. The method of manufacturing a semiconductor device as claimed in claim 10, wherein the purge gas is introduced from an upper side of the opening shaped like a rectangle into the holding part to discharge the atmosphere in the holding part through at least a lower side of the opening to replace the atmosphere in the holding part with the purge gas.

* * * * *